United States Patent
Walker et al.

(10) Patent No.: US 11,329,048 B2
(45) Date of Patent: May 10, 2022

(54) DRAM WITH SELECTIVE EPITAXIAL TRANSISTOR AND BURIED BITLINE

(71) Applicant: Integrated Silicon Solution, (Cayman) Inc., Grand Cayman (KY)

(72) Inventors: Andrew J. Walker, Mountain View, CA (US); Dafna Beery, Palo Alto, CA (US); Peter Cuevas, Los Gatos, CA (US); Amitay Levi, Cupertino, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/828,879

(22) Filed: Mar. 24, 2020

(65) Prior Publication Data
US 2021/0305256 A1    Sep. 30, 2021

(51) Int. Cl.
| | |
|---|---|
| *H01L 27/108* | (2006.01) |
| *H01L 29/45* | (2006.01) |
| *H01L 29/78* | (2006.01) |
| *H01L 29/10* | (2006.01) |
| *H01L 29/66* | (2006.01) |
| *H01L 21/311* | (2006.01) |
| *H01L 21/3065* | (2006.01) |
| *H01L 29/423* | (2006.01) |

(52) U.S. Cl.
CPC .... *H01L 27/10814* (2013.01); *H01L 21/3065* (2013.01); *H01L 21/31116* (2013.01); *H01L 27/10855* (2013.01); *H01L 27/10873* (2013.01); *H01L 29/1037* (2013.01); *H01L 29/42356* (2013.01); *H01L 29/45* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 3,387,286 A | 6/1968 | Dennard | |
| 5,382,540 A * | 1/1995 | Sharma | H01L 27/115 257/E21.693 |

(Continued)

OTHER PUBLICATIONS

Deleonibus, S., "Marvels of Microelectronic Technology: The 1T-1C Dynamic Random Access Memory, From a Groundbreaking Idea to a Business Benchmark," IEEE Electron Devices Society Newsletter, vol. 26, No. 4, Oct. 2019, pp. 1-9.

(Continued)

*Primary Examiner* — Anthony Ho
*Assistant Examiner* — Kevin Quinto

(57) ABSTRACT

A DRAM memory cell and memory cell array incorporating a metal silicide bit line buried within a doped portion of a semiconductor substrate and a vertical semiconductor structure electrically connected with a memory element such as a capacitive memory element. The buried metal silicide layer functions as a bit buried bit line which can provide a bit line voltage to the capacitive memory element via the vertical transistor structure. The buried metal silicide layer can be formed by allotaxy or mesotaxy. The vertical semiconductor structure can be formed by epitaxially growing a semiconductor material on an etched surface of the doped portion of the semiconductor substrate.

19 Claims, 22 Drawing Sheets

(56) References Cited

U.S. PATENT DOCUMENTS

| | | | |
|---|---|---|---|
| 5,958,505 A * | 9/1999 | Manti | H01L 21/02164 |
| | | | 438/225 |
| 9,472,542 B2 | 10/2016 | Mueller et al. | |
| 2007/0277875 A1* | 12/2007 | Gadkaree | H01L 31/0392 |
| | | | 136/256 |
| 2009/0084308 A1* | 4/2009 | Kishi | C30B 35/002 |
| | | | 117/13 |
| 2013/0146958 A1* | 6/2013 | Kim | H01L 21/32053 |
| | | | 257/302 |

OTHER PUBLICATIONS

Techinsights, "Technology Roadmap of DRAM for Three Major Manufacturers: Samsung, SK-Hynix and Micron," TechInsights, Oct. 2014, 22 pages.

Kim et al., "Flipping Bits in Memory Without Accessing Them: An Experimental Study of DRAM Disturbance Errors," IEEE, 2014, pp. 1-12.

Mutlu, O., "The Row Hammer Problem and Other Issues We May Face as Memory Becomes Denser," 2017, pp. 1-6, retrieved from https://people.inf.ethz.ch/omutlu/pub/rowhammer-and-other-memory-issues_date17.pdf.

Udrea et al., "The MOS Inversion Layer as a Minority Carrier Injector," IEEE Electron Device Letters, vol. 17, No. 9, Sep. 1996, pp. 425-427.

Walker et al., U.S. Appl. No. 16/774,928, filed Jan. 28, 2020.

Mantl, S., "Molecular beam allotaxy: a new approach to epitaxial heterostructures," Journal of Physics D: Applied Physics, vol. 31, 1998, pp. 1-17.

Restriction Requirement from U.S. Appl. No. 16/774,928, dated Mar. 9, 2021.

Prall et al., "Benchmarking and Metrics for Emerging Memories," IEEE, 2017, 5 pages.

Lee et al. "A Proposal on an Optimized Device Structure With Experimental Studies on Recent Devices for the DRAM Dell Transistor," IEEE Transactions on Electron Devices, vol. 54, No. 12, Dec. 2007, pp. 3325-3335.

Kim et al., "A New Investigation of Data Retention Time in Truly Nanoscaled DRAMs," IEEE Electron Device Letters, vol. 30, No. 8, Aug. 2009, pp. 846-848.

Kang et al., "Trap-Assisted DRAM Row Hammer Effect," IEEE Electron Device Letters, vol. 40, No. 3, Mar. 2019, pp. 391-394.

Gautam et al., "Row Hammering Mitigation Using Metal Nanowire in Saddle Fin DRAM," IEEE Transactions on Electron Devices, vol. 66, No. 10, Oct. 2019, pp. 4170-4175.

Sunami, H., "Cell Structures for Future Dram's," IEEE, IEDM, 1985, pp. 694-697.

Han et al., "Soft Error in Saddle Fin Based DRAM," IEEE Electron Device Letters, vol. 40, No. 4, Apr. 2019, pp. 494-497.

Reader et al., "Transition metal silicides in silicon technology," Reports on Progress in Physics, vol. 56, 1992, pp. 1397-1467.

* cited by examiner

DRAM WITH SELECTIVE EPITAXIAL TRANSISTOR AND BURIED BITLINE

FIELD OF THE INVENTION

The present invention relates Dynamic Random-Access memory (DRAM) and more particularly to a DRAM device incorporating an epitaxially grown vertical semiconductor transistor and a metal silicide bitline buried with a doped region of the substrate.

BACKGROUND

Dynamic Random Access Memory (DRAM) is a type of memory storage that can be utilized for storing information in programmable systems. DRAM may be fabricated as an array comprising individual memory cells containing a transistor in combination with a charge-storage device (such as, for example, a capacitor). Bitlines and wordlines may extend across the array, and may be utilized for accessing individual memory cells.

A continuing goal is to increase integration, and accordingly to increase packing density of the DRAM system. A problem encountered as DRAM is packed to higher density is that crosstalk between adjacent word-lines (sometimes referred to as Row-Hammer) becomes problematic. A challenge regarding further scaling of DRAM cells involves having sufficient lateral room to fit the capacitor, select transistor, bitline, wordline, two contacts and field isolation. This has become a monumental task hindering further scalability.

SUMMARY

The present invention provides a memory structure that includes a semiconductor substrate having a doped region. A metal silicide layer is buried within the doped region of the substrate. A vertical transistor structure is formed on the doped region of the substrate, and a capacitive memory element is electrically connected with the vertical transistor structure.

The vertical transistor structure can include a semiconductor pillar structure formed on the doped portion of the substrate, and a gate dielectric layer formed at the side of the semiconductor pillar structure. An electrically conductive gate structure is formed to at least partially surround the semiconductor pillar structure and gate dielectric such that the gate dielectric layer separates the electrically conductive gate structure from the semiconductor pillar structure. The semiconductor pillar structure can include an epitaxial semiconductor material that is substantially monocrystalline. For example, the epitaxial semiconductor material can be at least 80 percent monocrystalline by volume or more preferably at least 90 atomic percent monocrystalline by volume.

An electrically conductive contact can be provided between the vertical transistor structure and the capacitive memory element to provide electrical connection between the vertical transistor structure and the capacitive memory element. The buried metal silicide layer can be formed to define a bitline structure, which can be electrically connected with bitline circuitry. The electrically conductive gate structure can be electrically connected with wordline circuitry. The memory structure can be part of a memory array that includes a plurality of such memory structure which can be formed in rows and columns connected with a plurality of wordlines and bitlines.

The buried metal silicide layer can be formed by mesotaxy or allotaxy such as by co-depositing a metal such as Co along with semiconductor material or by implantation of a metal such as Co into a doped semiconductor material and then performing a high temperature anneal to cause the metal (e.g. Co) to precipitate into an atomically smooth layer while causing the doped semiconductor to remain essentially monocrystalline.

The combination of a buried metal silicide bitline with an epitaxially grown vertical semiconductor transistor provides for a DRAM cell and array with greatly reduced cell size footprint and greatly increased performance. The structure is immune from row hammer disturb with improvements in radiation hardness and better, lower power refresh.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Dynamic Random-Access Memory (DRAM) is a promising solid state memory technology with a continuous scaling path that has evolved from minimum feature sizes of several microns to advanced structures of today with minimum feature sizes of just less than 20 nm. However, various structural and manufacturing limitations have limited further improvements in memory density and performance of DRAM.

Figure 1:
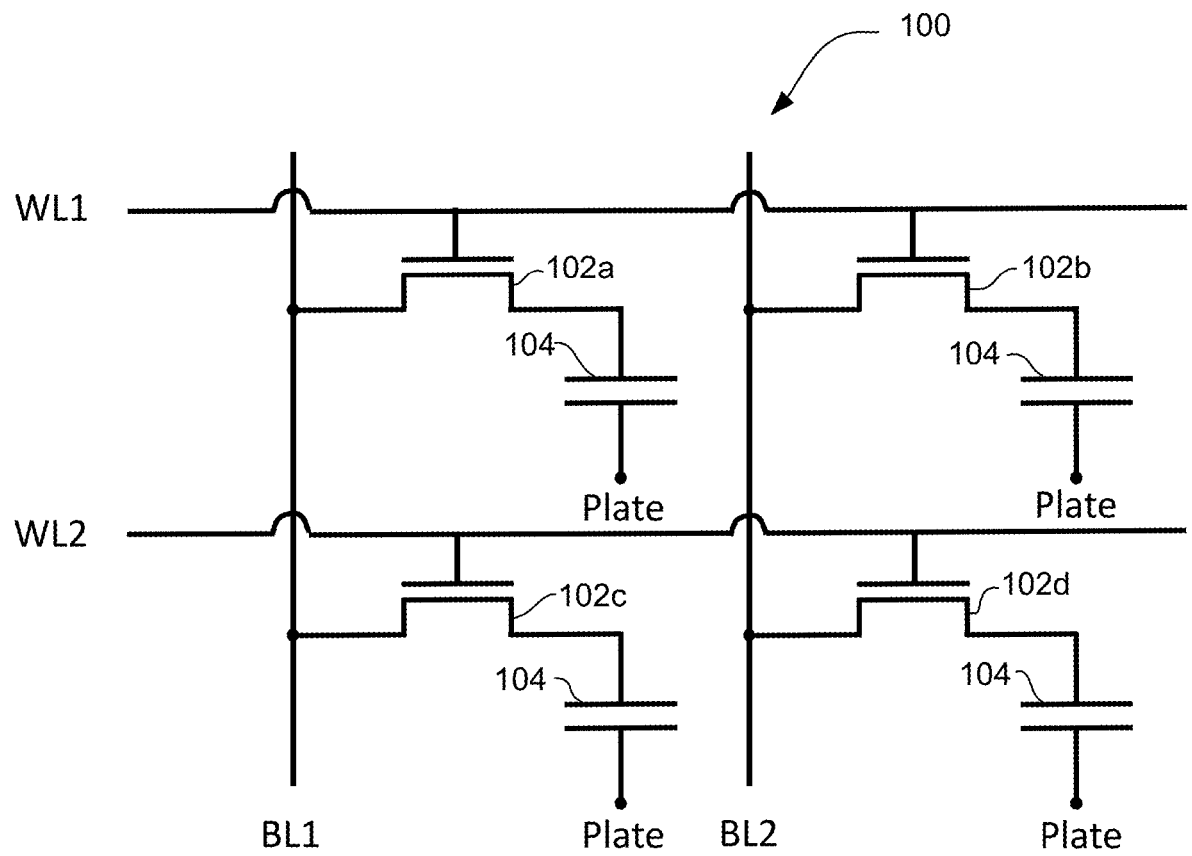
FIG. 1 is an electrical schematic of a DRAM array.

FIG. 1 shows a schematic illustration of a DRAM system 100. The DRAM system 100 includes rows of wordlines WL1, WL2, etc. and columns of bitlines BL1, BL2, etc. The wordlines WL1, WL2 are connected with gates of transistors 102. The bitlines BL1, BL2 are connected with source regions of transistors 102. The drains of the transistors 102 are connected with an assigned memory storage element 104. The memory storage element can be a capacitor as shown in FIG. 1, although the memory storage element could be some other type of device capable of recording a memory state when a voltage or current is applied. When a voltage is applied to the gate of a transistor 102 by a wordline WL, the transistor 102 is opened and a voltage can be applied to the memory element 102 by the bitline BL to either write or read a data bit to or from the associated memory storage element 104.

DRAM systems have been formed within a semiconductor substrate using semiconductor fabricating processes familiar to those skilled in the art. As a result, further scaling of such DRAM systems is reaching a practical limit. This is because of various structural limitations such as required lateral spacing and various disturb mechanisms inherent in such designs.

Figure 2:
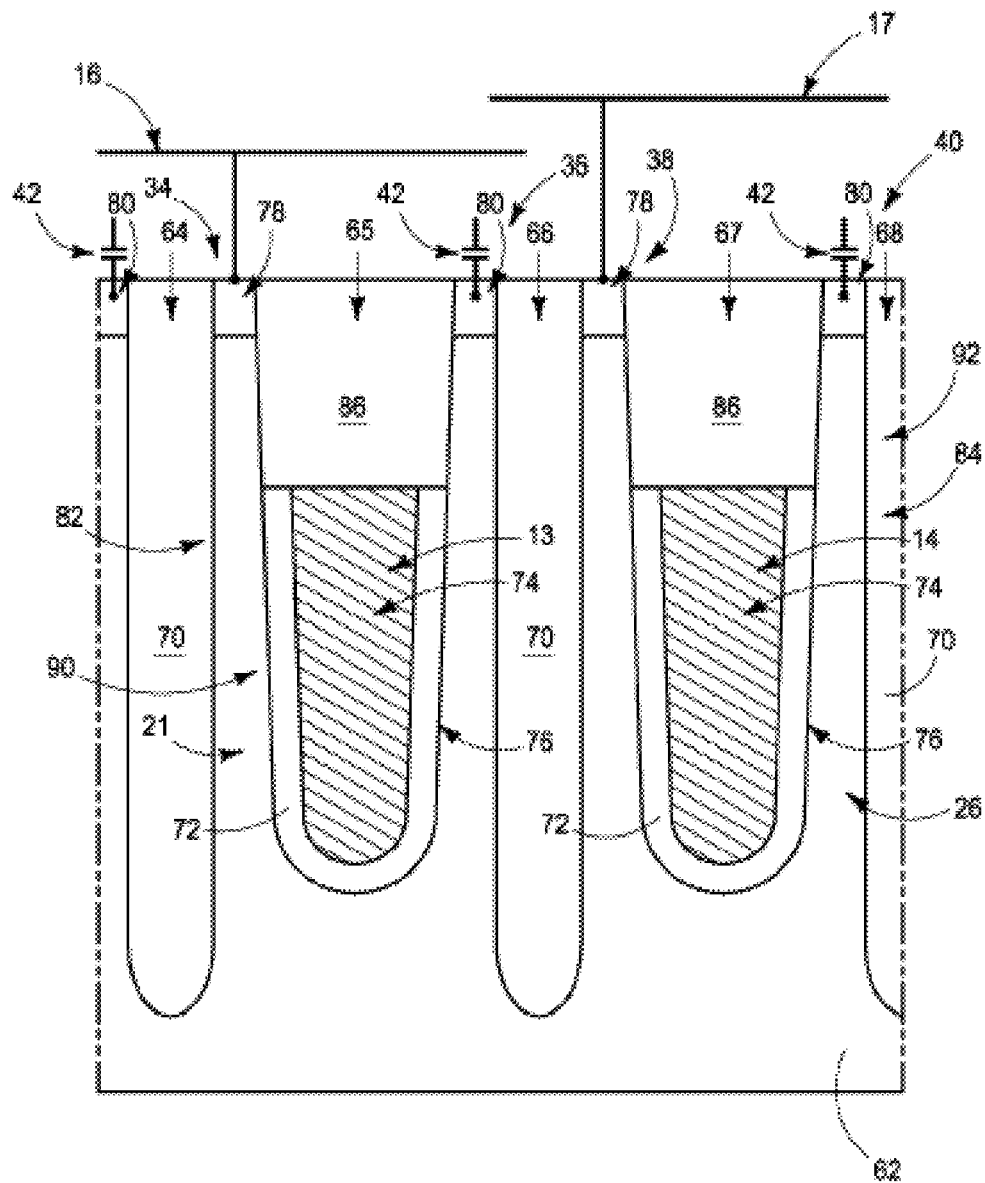
FIG. 2 is a cross-sectional view of a prior art DRAM memory cell.

FIG. 2 illustrates an example of such a prior art DRAM structure. Referring to FIG. 2, a DRAM array 60 is shown in cross-sectional side view. The DRAM array 60 comprises a base material 62. Such base material may be a semiconductor material, and in some embodiments may comprise, consist essentially of, or consist of monocrystalline silicon. In some embodiments, base material 62 may comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base material 62 may comprise a semiconductor substrate containing one or more materials associated with integrated circuit fabrication. Some of the materials may be under the shown region of base material 62 and/or may be laterally adjacent to the shown region of base material 62; and may correspond to, for example, one or more of refractory metal materials, barrier materials, diffusion materials, insulator materials, etc.

Trenches 64-68 extend into base material 62. Such trenches are configured in a pattern of alternating deep trenches (64, 66 and 68) and shallow trenches (65 and 67).

Electrically insulative material 70 is within the deep trenches (64, 66 and 68), and in the shown embodiment completely fills the deep trenches. Such electrically insulative material may comprise any suitable composition or combination of compositions; and in some embodiments may comprise, consist essentially of, or consist of one or both of silicon dioxide and silicon nitride. In the shown embodiment, material 70 is the only material within the deep trenches. The electrically insulative material 70 within the deep trenches may be sufficient by itself to prevent crosstalk between adjacent wordlines (e.g., may be sufficient to prevent the row-hammer problem of conventional DRAM array architectures). This is in contrast to some prior art DRAM configurations in which electrically biased conductive materials are provided between adjacent memory cells to enhance electrical isolation of memory cells.

The wordlines 13 and 14 are within shallow trenches 65 and 67, respectively. Such wordlines may be considered to be examples of electrically conductive lines that may be formed within the shallow trenches.

The wordlines are spaced from semiconductor material of base 62 by gate dielectric material 72. The gate dielectric material may comprise any suitable composition or combination of compositions; and in some embodiments may comprise, consist essentially of, or consist of silicon dioxide. The illustrated regions of the wordlines along the cross-section of FIG. 2 correspond to transistor gates 74.

The cell active areas 21 and 26 are shown to be trough-shaped (specifically, U-shaped in the shown embodiment), and to correspond to transistor active areas. Such transistor active areas comprise channel regions 76 adjacent the transistor gates, and comprise source/drain regions 78 and 80 at upper regions of the trough-shapes. The source/drain regions may be conductively-doped regions of semiconductor material of base 62. For instance, the source/drain regions may be n-type doped regions or p-type doped regions within a silicon-containing base 62 in some embodiments.

The channel region 76 may also be a doped region within semiconductor material of base 62, and specifically may be doped to obtain a desired threshold voltage.

The transistor gates 74, channel regions 76 and source/drain regions 78/80 together form a pair of transistors 82 and 84. The transistors 82 and 84 are illustrated relative to the cell active material structures 21 and 26, respectively. Similar transistors are at all of the other cell active material structures 20, 22-25 and 27-31 of FIG. 1, and accordingly the transistors 82 and 84 are representative of a plurality of transistors present within an example embodiment DRAM array. In some embodiments, the transistor gates 74, channel regions 76 and source/drain regions 78/80 may be considered as together comprising such plurality of transistors.

In the shown embodiment, electrically insulative material 86 is formed over wordlines 13 and 14 within the shallow trenches 65 and 67. Such electrically insulative material may comprise any suitable composition or combination of compositions; and in some embodiments may comprise, consist essentially of, or consist of one or both of silicon dioxide and silicon nitride.

The wordlines 13 and 14 may be formed to any suitable thickness within the shallow trenches 65 and 67. In some embodiments, the wordlines and the gate dielectric material 72 together fill less than 80% of the overall depths of the shallow trenches.

The source/drain regions 78/80 may be considered to be paired source/drain regions associated with individual transistors. In the shown embodiment, one of the paired source/drain regions (specifically, source/drain region 78) is electrically coupled with a bitline (the bitlines 16 and 17 are diagrammatically illustrated in FIG. 2), and the other of the paired source/drain regions (specifically, source/drain region 80) is electrically coupled with a charge storage device (capacitors 42 are diagrammatically illustrated in FIG. 2 as example charge storage devices). In some embodiments, the bitlines may be electrically coupled to drain regions, and the charge storage devices may be electrically coupled to source regions.

The source/drain regions 78/80 of FIG. 2 correspond to the first and second sides of the cell active material structures 20-31 of FIG. 1. For instance, source/drain regions 78 and 80 of transistor 82 correspond to first and second sides 34 and 36 of the cell active material structure 21; and source/drain regions 78 and 80 of transistor 84 correspond to first and second sides 38 and 40 of cell active material structure 26.

The configuration of FIG. 2 has wordlines 13 and 14 extending along a first direction (specifically, in and out of the page relative to the cross-section of FIG. 2) and has bitlines extending along a second direction which intersects the first direction (with the illustrated bitlines 16 and 17 extending horizontally along the plane of the cross-section of FIG. 2).

Memory cells within the configuration of FIG. 2 may be considered to comprise a transistor coupled with a charge storage device. Thus, transistor 82 and the associated charge storage device 42 coupled therewith may be considered to correspond to a first memory cell 90, and the transistor 84 together with the charge storage device 42 coupled therewith may be considered to correspond to a second memory cell 92. The wordlines 13 and 14 pass through the memory cells 90 and 92, respectively. In the shown embodiment, the memory cells 90 and 92 are directly adjacent one another, and separated from one another only by an intervening deep trench 66 filled with electrically insulative material 70. The adjacent memory cells 90 and 92 each have a unique bitline connection.

As can be understood, a DRAM array such as that illustrated with reference to FIG. 2 presents certain scaling challenges that limit increases in data density. The DRAM disturb mechanisms that are becoming of serious concern are transistor leakage and Row Hammer. To understand these mechanisms, the layout and transistor structure of advanced DRAM need to be understood. As shown in FIG. 2 and as described above, it can be seen that the memory system 42 that each memory cell includes a bitline (16, 17) connected to heavily doped diffusion regions 78 located in the substrate 62. In addition, the storage capacitors 42 are connected to the heavily doped diffusion regions 80. Diffusion regions 78, 80 act as the source and drain of a field effect device whose gate 74 and gate dielectric 72 are recessed into the substrate. The gate 74 is part of the wordline of the DRAM. This field effect transistor (usually NMOS) is a very special device made for DRAM that has to have good current drive (e.g. greater than 10 uA) and low leakage.

If a transistor 102 (FIG. 1) leaks while in the off state, it will discharge its associated capacitor 104 if the capacitor is held at a positive potential. Therefore, leakage of such recessed channel transistors has to be in the femtoAmp regime. A major source of transistor leakage is the high electric field at the gate overlapped source/drain region of the transistor.

In the case of Row Hammer, electrons are injected from a cell whose gate is toggled in such a way as to turn the cell transistor on and off many times. These electrons migrate in the local substrate and can be picked up by storage nodes that are connected to capacitors that are at a positive potential. Over time, this cumulative effect can be such that the voltage on these storage nodes droop and can no longer be sensed as they should be. In other words, "hammering" a wordline row can corrupt data in adjacent non-accessed rows. The key to this insidious failure mode is that enough electrons get cumulatively picked up by a nearby cell on a different wordline to cause corruption of data before a DRAM refresh is made. Row Hammer has become a major threat to data integrity in advanced DRAM systems, because the distance between cells is small enough for migrating electrons to reach and the storage capacitance has reduced with scaling.

A similar device physics challenge arises in the case of DRAM's susceptibility to soft errors induced by radiation. In this case, neutrons or alpha particles create electron-hole pairs in the vicinity of critical junctions. If the capacitance of these nodes is small enough and the collected charge large enough, internal circuit voltages can be changed. In a DRAM system, the storage node diffusion is connected to a capacitor of between 10 and 20 fF. This capacitance has been decreasing as DRAM has scaled to higher densities. Since the storage node diffusion is in the substrate where most of the electron-hole pairs are formed, it is susceptible to charge pick up. In this way, DRAM data can be corrupted through soft errors.

There remains, therefore, a need for a DRAM cell structure that overcome these challenges in order to further scale DRAM to higher data density while maintaining data integrity. Embodiments of the present invention such as described herein below overcome these challenges by: (1) replacing the prior art DRAM select transistor with a vertical channel transistor wherein the channel has been formed through selective epitaxy; (2) forming the bitline within the semiconductor substrate in the form of a buried metal silicide layer.

Figure 3:
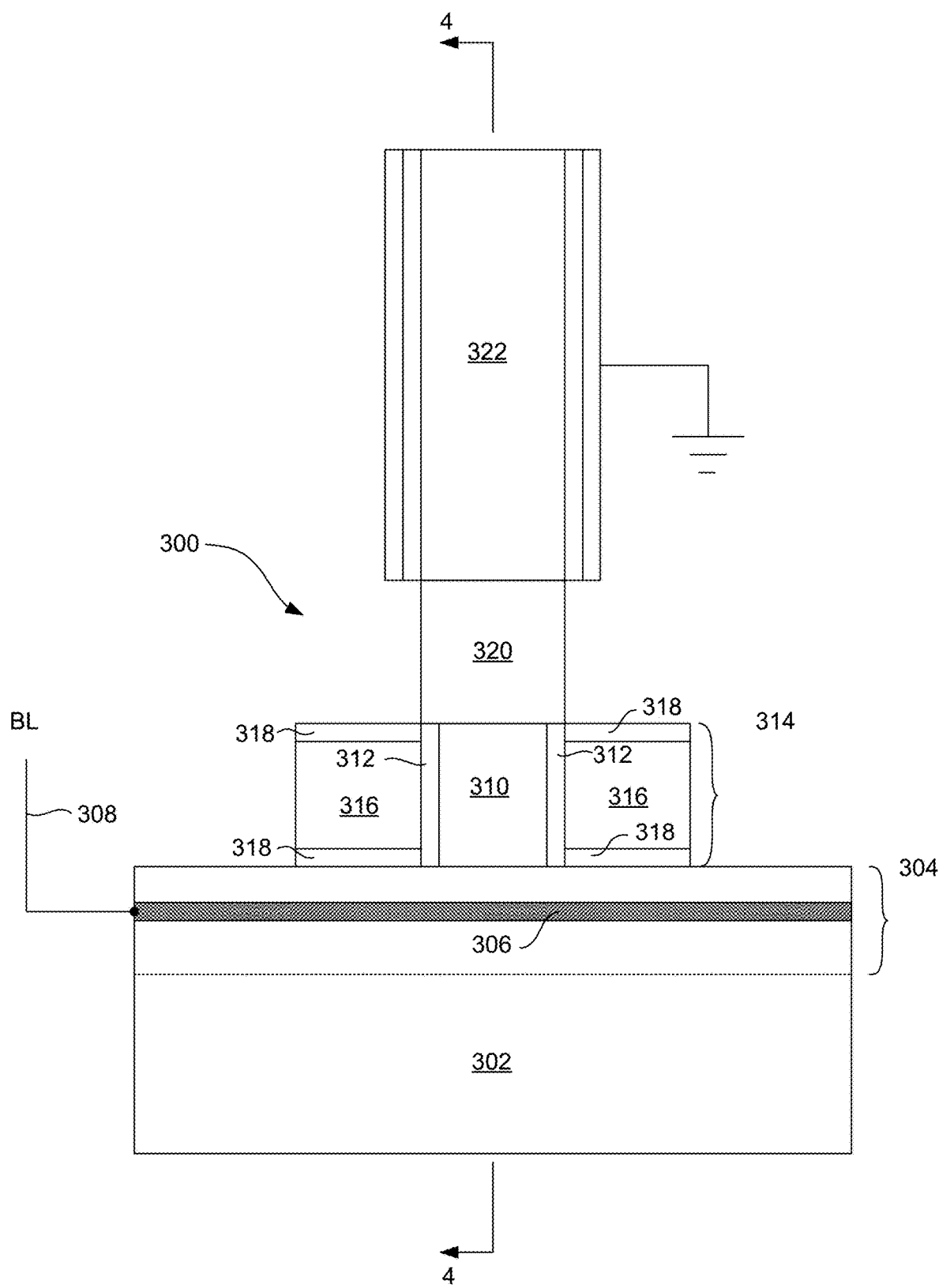
FIG. 3 is a cross-sectional view of a DRAM cell according to an embodiment.

FIG. 3 shows a cross-sectional view of a DRAM memory cell 300 according to an embodiment. The DRAM cell 300 is formed on a semiconductor substrate 302, which can be, for example, a silicon wafer (Si) or some other suitable crystalline semiconductor such as SiGe. The semiconductor substrate 302 has an upper portion 304 that is N+ or P+ doped. The upper portion 304 can be doped by ion implantation or during deposition.

Buried within the doped portion 304 is a layer of metal silicide 306. The metal silicide layer 306 can be formed by Mesotaxy (also referred to as ion-beam synthesis) and subsequent thermal annealing, or alternatively by Allotaxy where a metal is co-deposited with silicon using either molecular beam epitaxy (MBE) or chemical vapor deposition (CVD) with subsequent annealing. These methods will be discussed in greater detail herein below. The above described processes result in a highly electrically conductive metal silicide layer 306 that is buried in the doped monocrystalline or nearly monocrystalline semiconductor 304. The doped semiconductor 304 is preferably at least 80 percent monocrystalline by volume or more preferably at least 90 percent monocrystalline by volume. The metal silicide layer 306 can be electrically connected with bitline circuitry BL, as indicated schematically by lead line 308.

A semiconductor pillar structure 310 is formed on and in directed contact with the upper portion of the doped portion 304 of the substrate 302. The semiconductor pillar 310 can be a material such as Si, SiGe, InGaAs, etc. The semiconductor pillar 310 is formed by selective epitaxial growth on the surface of the doped portion 304 of the substrate 302. This epitaxial growth, which will be discussed in greater detail herein below, allows the semiconductor pillar 310 to have a monocrystalline or nearly monocrystalline structure. For example, the epitaxially grown semiconductor pillar 310 can have a structure that is at least 80 percent monocrystalline or more preferably at least 90 percent monocrystalline by volume. This monocrystalline or nearly monocrystalline structure results in optimal transistor performance, such as reduced leakage when in an "off" state, and increased conductivity in an "on" state. The semiconductor pillar 310 can have a cylindrical pillar shape, or could have some other shape such as a rectangular prism shape. The upper and lower portions of the semiconductor pillar structure are N+ or P+ doped to form a channel structure therebetween.

The semiconductor pillar 310 is surrounded at its side by a thin gate dielectric layer 312. The gate dielectric layer 312 can be formed of an oxide, such as silicon oxide. A gate structure 314 surrounds the semiconductor pillar structure 310 and the gate dielectric 312. The gate structure 314 includes an electrically conductive gate material 316 such as highly doped polysilicon, and upper and lower dielectric layers 318, which can be constructed of an oxide such as silicon oxide.

An electrical contact structure 320 is formed on and electrically connected with the upper end of the semiconductor pillar structure 310. A capacitive memory element structure 322 is formed on and electrically connected with the contact 320. The capacitor structure 322 is connected with a plate, that can be at ground (as shown) or at a voltage potential.

Figure 4:
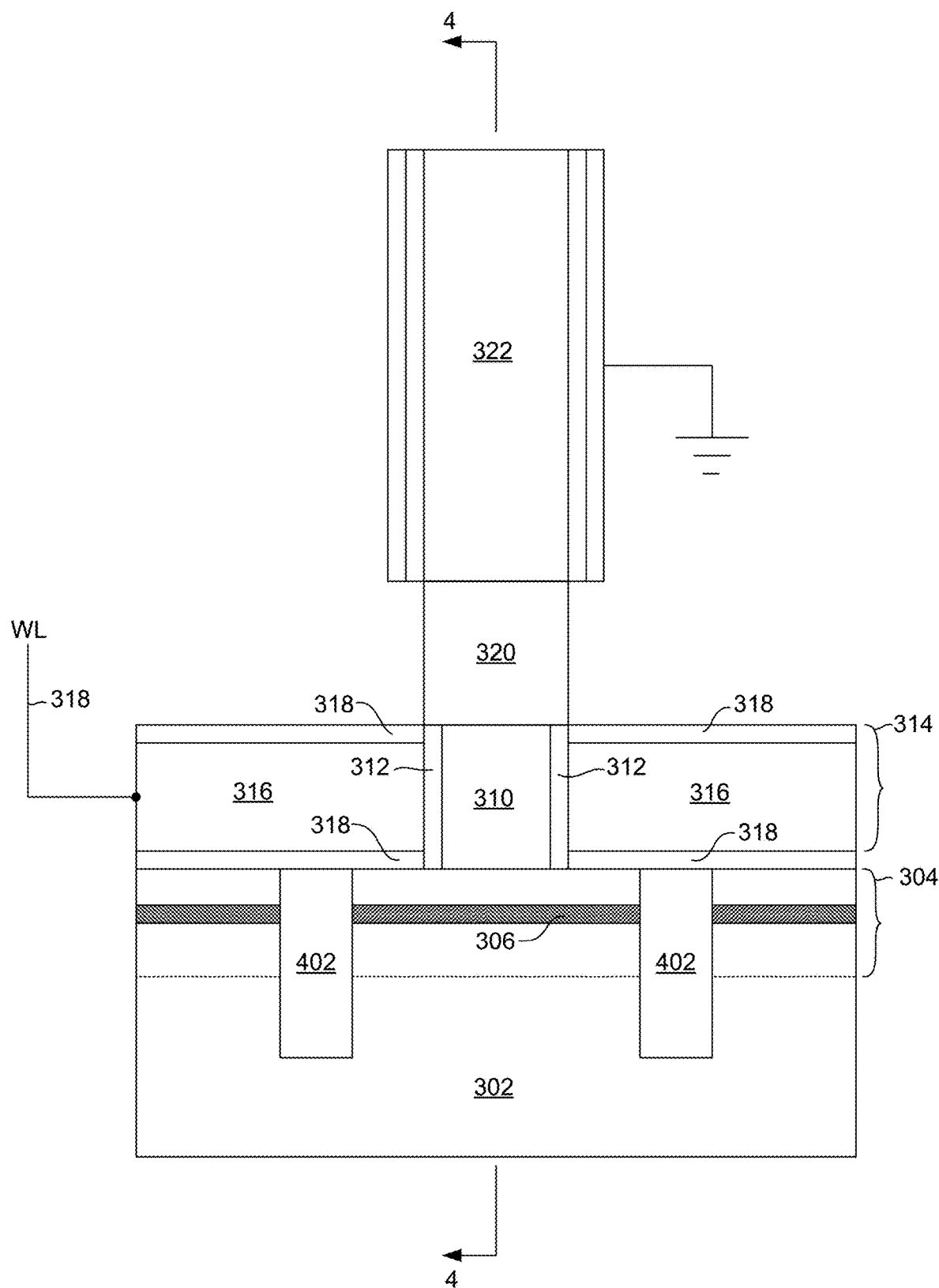
FIG. 4 is a cross-sectional view of the DRAM cell of FIG. 3 as seen from line 4-4 of FIG. 3.
Figure 5:
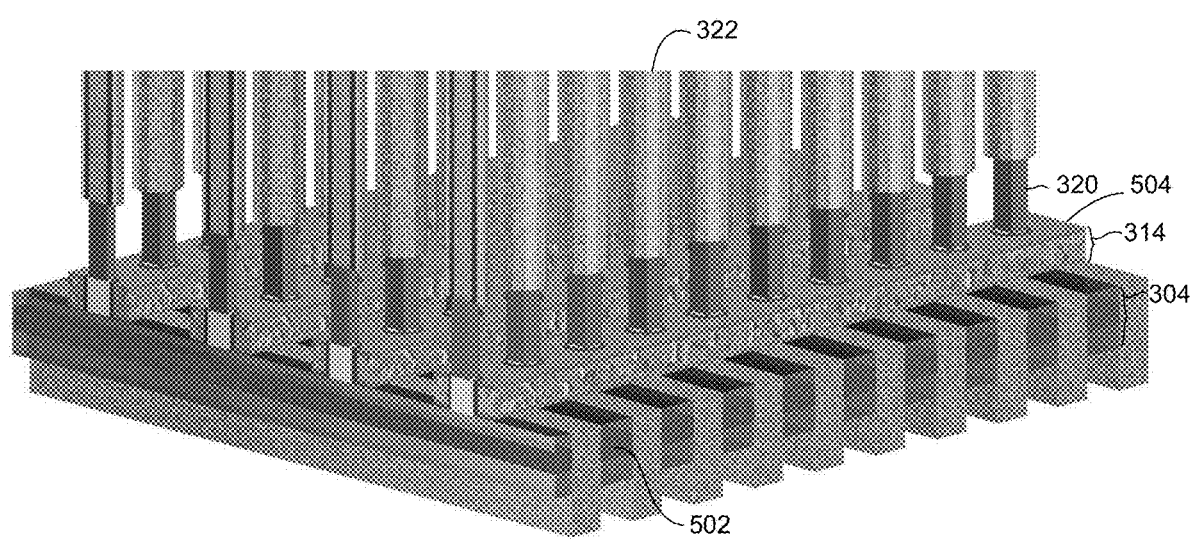
FIG. 5 is a perspective view of an array of DRAM cells according to an embodiment.

FIG. 4 shows a cross sectional view as seen from line 4-4 of FIG. 3, that is perpendicular to the view of FIG. 3. While FIG. 3 shows the metal silicide layer 306 extending beyond the memory element 300 to connect to bitline circuitry BL, FIG. 4 shows the gate structure 314 extending beyond the memory element structure 300 to connect with word line circuitry WL. It should be pointed out that, while only one memory element structure 300 is shown in FIGS. 3 and 4, the memory element 300 would actually be one or many such structures in an array of memory element structures. The gate structure 314 as shown in FIG. 4 would extend to many other similar pillar structures 310 and gate dielectric layers to form a row of transistor structure. Similarly, the metal silicide layer 306 as shown in FIG. 3, would extend to many other memory element structures in a row of memory elements that is perpendicular to the rows connected by the gate structure 314 shown in FIG. 4. This can be seen more clearly with reference to FIG. 5 which shows a perspective view of an array of memory elements arranged in perpendicular rows. As seen in FIGS. 4 and 5, trench isolation structures 402 are formed into the semiconductor substrate. The trench isolation structure can be an oxide such as silicon oxide and are formed to so as to extend significantly beneath the doped portion 304 of the substrate. The trench isolation structures divide the doped portions 304 and metal silicide layers 306 into individual rows of bitlines 502 which can be seen more clearly in FIG. 5. As seen in FIG. 5, the gate structures 314 form rows of wordlines 504 that can be perpendicular to the bitlines 502.

Figure 6:
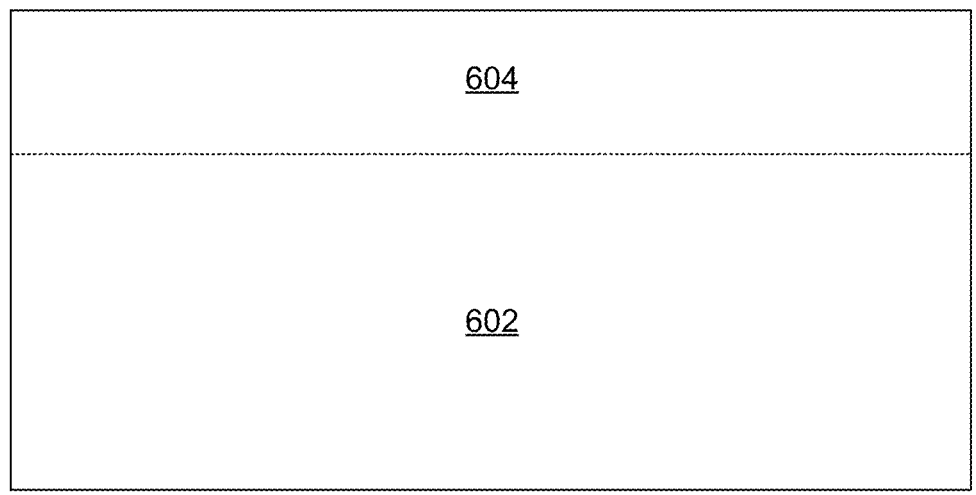
FIGS. 6-22 are views of a DRAM cell and array in various intermediate stages of manufacture in order to illustrate a method of manufacturing DRAM memory according to an embodiment.

FIGS. 6-22 show a wafer in various intermediate stages of manufacture in order to illustrate a method of manufacturing a DRAM memory according to an embodiment. With particular reference to FIG. 6, a semiconductor substrate 602 is provided. The semiconductor substrate 602 can be a monocrystalline Si wafer or could be silicon-on-insulator.

Figure 7:
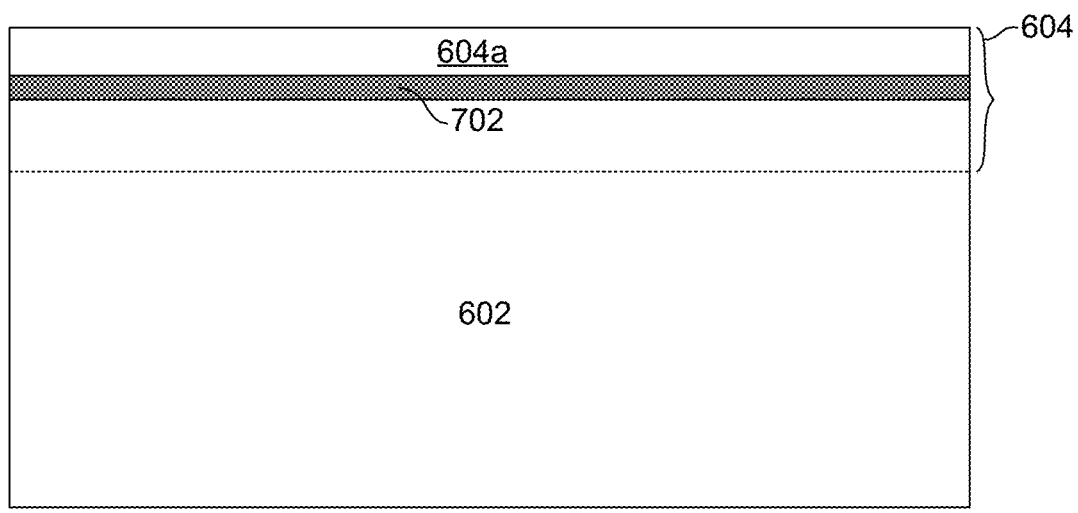

With reference now to FIG. 6, an N+ or P+ doped portion 604 is formed at the upper region of the substrate 602. This can be performed by ion implantation or through deposition of a semiconductor material such as Si along with doping material. As shown in FIG. 7, a thin layer of metal silicide 702 is formed within the doped region 602. The formation of the silicide layer 702 buried within the doped region 602 can be performed by Mesotaxy, also referred to as ion-beam synthesis along with subsequent annealing, or by Allotaxy wherein a metal is co-deposited with silicon using either Molecular Beam Epitaxy (MBE) or Chemical Vapor Deposition (CVD) with subsequent annealing.

Mesotaxy:

Mesotaxial formation of a metal silicide layer involves ion beam synthesis of monocrystalline metal of metal silicide films in silicon films. A high dose of metal implant, preferably cobalt, is carried out into the silicon wafer while the wafer is heated at an optimum temperature. After implantation, a high temperature anneal is carried out that results in a buried layer of atomically smooth metal silicide 702 being buried within the doped region 604. As a result of annealing, the doped region 604, especially the upper portion of the doped region 604a, has an advantageous monocrystalline or nearly monocrystalline structure, such as at least 80 percent monocrystalline by volume or more preferably at least 90 percent monocrystalline by volume. In the ion-beam synthesis technique, a substrate is implanted with reactive ions, which are accelerated to a high energy, so that the maximum of implanted distribution lies well below the surface. The formation of these layers requires the implantation of a high dose of ions. This can be envisaged when one realizes that the level of implanted element must be comparable with its concentration in the compound, i.e. in the order of tens of atomic percent. Implantation of these high fluences of energetic ions will lead to severe damage in the substrate. Consequently, these implantations have to be carried out at elevated temperature in order to dynamically anneal the damage during the implantations. The concentration of the implanted element will at some stage during the implantation exceed the solid solubility limit. From that point on, the implanted element will segregate and react with the substrate material to form precipitates. With increasing ion dose, these precipitates will coalesce into a buried layer 702. This process for mesotaxial formation of a metal silicide layer is discussed in Rep. Prog. Phys. 56 (1992) 1397-1467.

Allotaxy:

In another method, the metal silicide layer 702 can be formed by Allotaxy. Co-deposition of silicon and a metal such as cobalt along with subsequent high temperature annealing can lead to the formation of the buried metal silicide layer 702 with flat and atomically abrupt interfaces. Deposition of the semiconductor (e.g. Si) and metal (i.e. Co) can be performed using molecular beam allotaxy, however, deposition by less expensive Chemical Vapor Deposition (CVD) may also be used. As with the previously described mesotaxial method, the annealing of the allotaxial formation of a metal silicide layer also results in monocrystalline or nearly monocrystalline doped semiconductor material 602. Allotaxial formation of metal silicide buried within a semiconductor is discussed in J. Phys. D: Appl. Phys. 31 (1998) 1-17.

Figure 8:
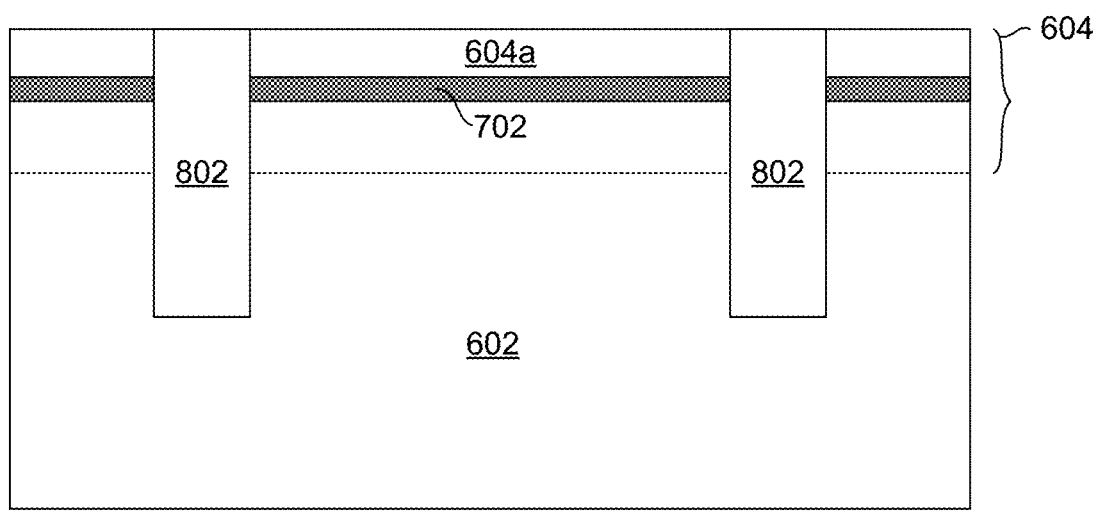
Figure 9:
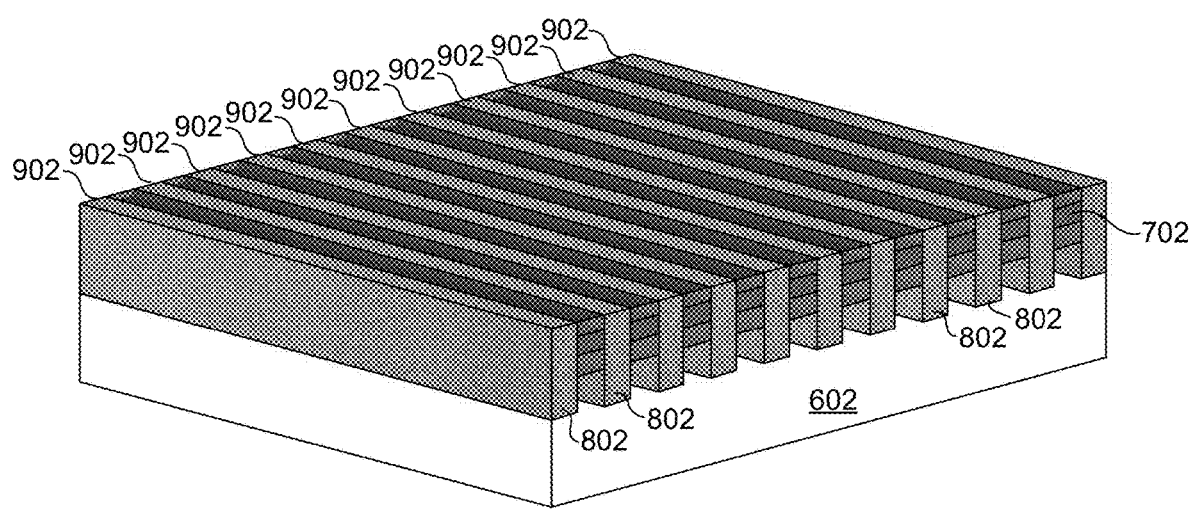

With the highly conductive metal silicide structure 702 formed buried within the monocrystalline doped semiconductor 604, the structure can be formed into individual bitline structures. With reference to FIG. 8, a series of trenches are formed in the substrate 802 and are then filled with a dielectric material to form trench isolation structures 802. The trenches can be formed by forming a mask having openings at the desired trench locations and then performing an etching process such as reactive ion etching (RIE) or ion beam etching (IBE). The resulting trenches can then be filled with an oxide such as silicon oxide and followed by a polishing process such as chemical mechanical polishing to planarize the surface, leaving structure such as that shown in FIG. 8. The trench isolation structure 802 are formed so as to extend significantly below the doped region 604 in order to provide effective electrical isolation between the regions separated by the trench isolation structures 802. While only two such trench isolation structures 802 are shown in FIG. 8, many such trench isolation structures would be formed in the substrate 602. FIG. 9 shows a perspective view, showing a plurality of bitlines 902 defined between a plurality of trench isolation structures. Each of the bitlines includes a metal silicide layer structure 702 buried within the doped region 604 of the substrate 602.

Figure 10:
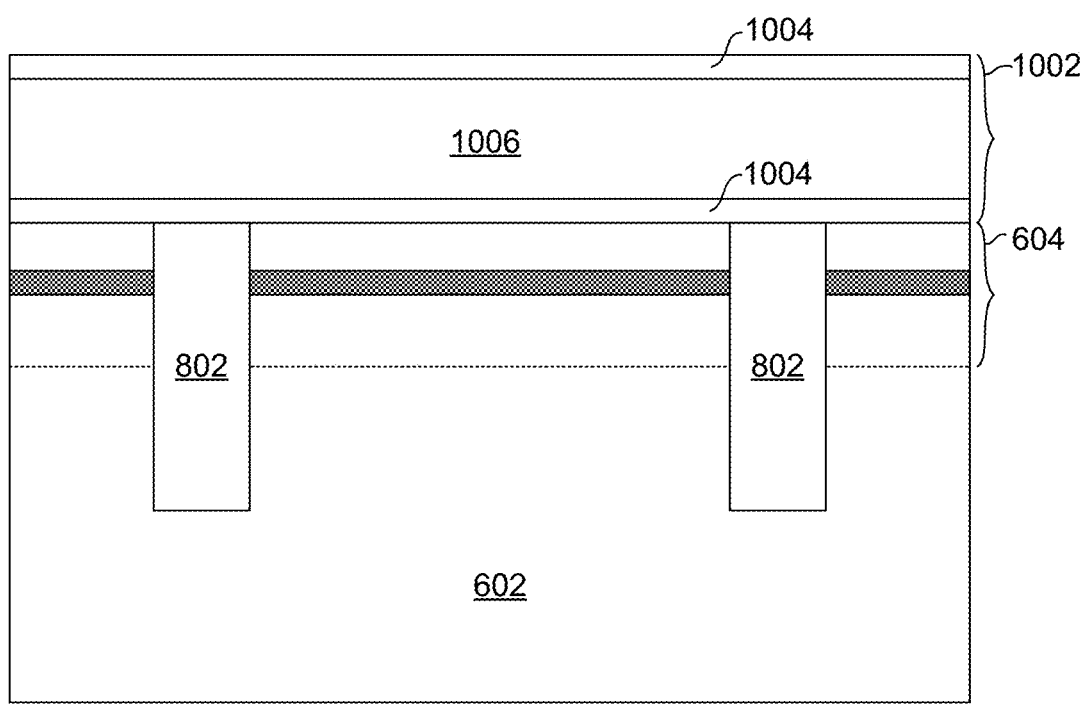

With reference now to FIG. 10, a series of gate structure layers 1002 are deposited full film over the doped upper portion 604 of the substrate 602. The gate structure layers 1002 can include a first or lower dielectric layer 1004, an electrically conductive gate layer 1006, and a second or upper dielectric layer 1008. The first and second dielectric layers 1004, 1008 can be an oxide such as silicon oxide, and the electrically conductive gate layer 1006 can be a highly doped semiconductor such as highly doped poly silicon.

Figure 11:
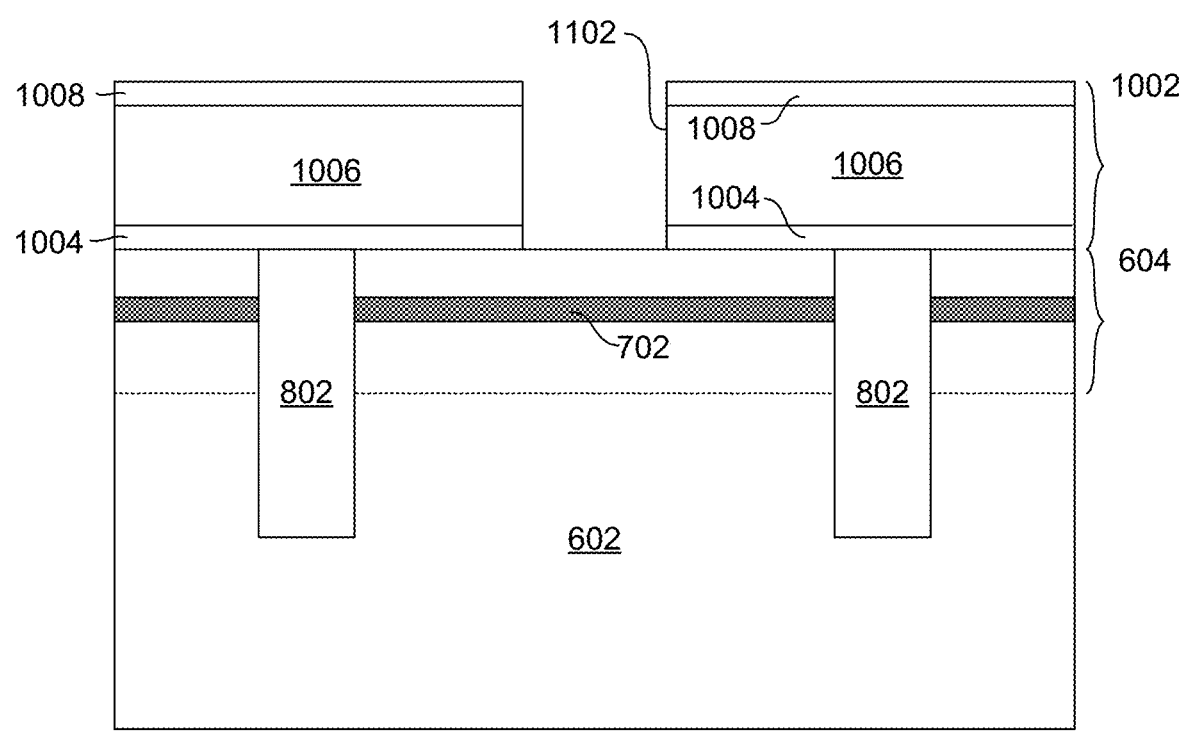

With reference to FIG. 11, a series of openings 1102 are formed in the gate structure layers 1002. While only one opening 1102 is shown in FIG. 11, this is for purposes of clarity and in actuality many such openings can be formed in rows in the bitlines defined between the trench isolation structures. The openings 1102 can be formed by constructing a mask (not shown) over the gate layers 1002, and performing an etching such as reactive ion etching (RIE) or ion beam etching (IBE).

Figure 12:
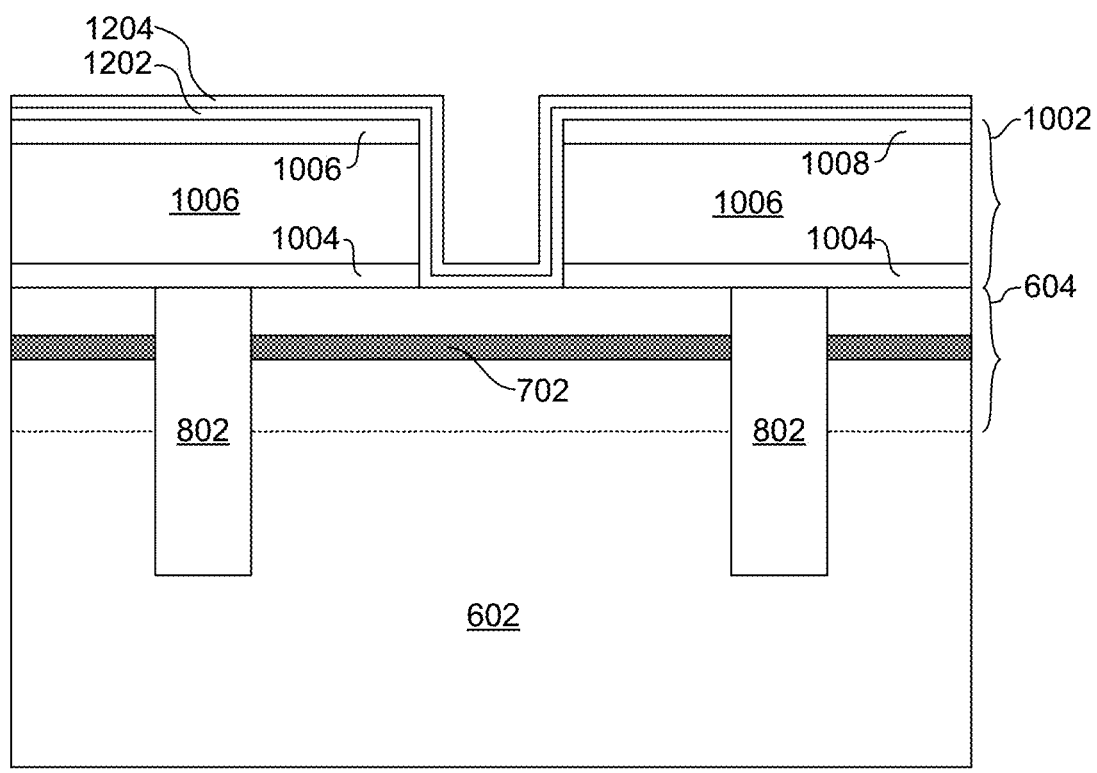

With reference now to FIG. 12, a thin gate dielectric layer 1202 is deposited. The gate dielectric layer can be an oxide such as silicon oxide and can be deposited by chemical vapor deposition (CVD) or atomic layer deposition (ALD). A protective layer 1204 can be deposited over the gate dielectric layer 1202. The protective layer 1204 can be a material such as amorphous silicon, and can be deposited by chemical vapor deposition (CVD) or atomic layer deposition (ALD).

Figure 13:
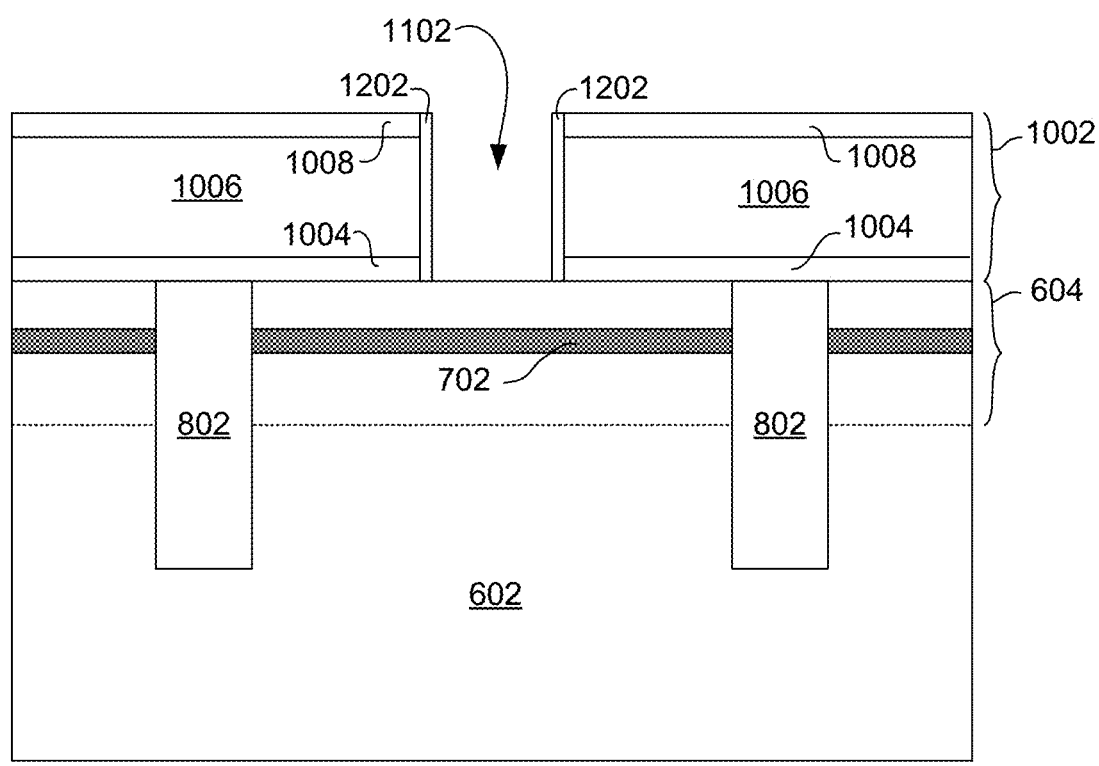

An anisotropic material removal process such as ion beam etching (IBE) is performed to preferentially remove horizontally disposed portions of the layers 1202, 1204 to open up the bottom of the opening to expose the doped semiconductor 602. A selective material removal process such as reactive ion etching (RIE) can then be performed to remove any of the remaining protective layer 1204, leaving a structure such as shown in FIG. 13, with gate dielectric material 1202 remaining on the inner sides of the opening 1102.

Figure 14:
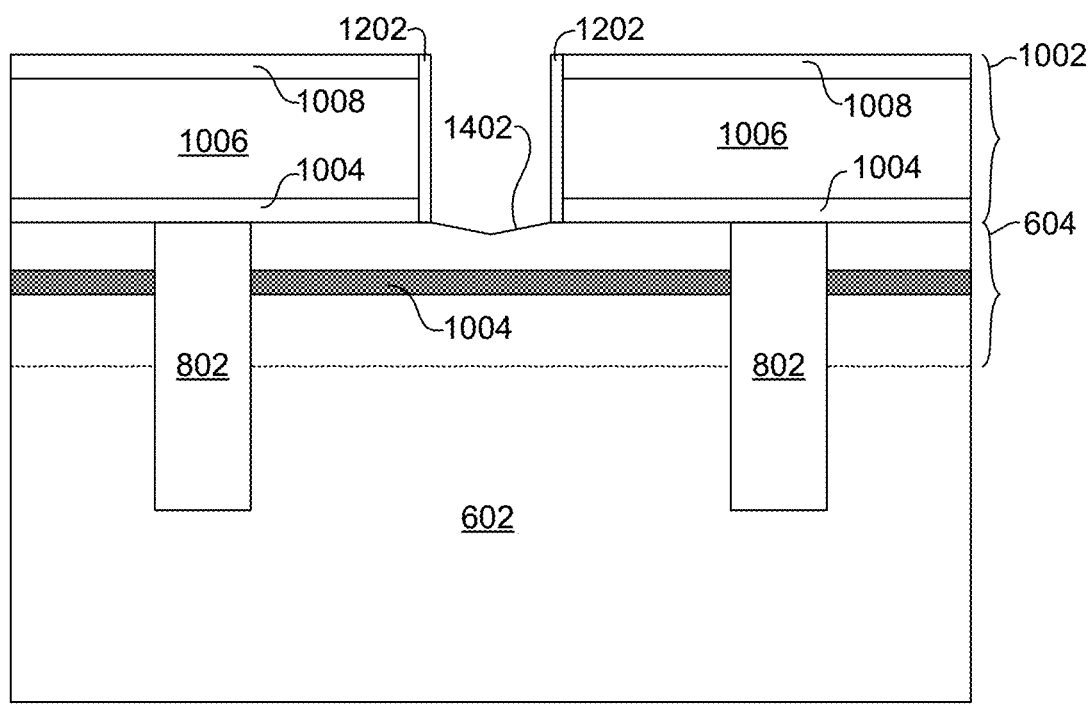

Further etching such as by reactive ion etching (RIE) can be performed to etch the surface of the doped region 602 of the substrate in order to remove any native oxide, leaving mono-crystalline or nearly monocrystalline semiconductor exposed at the bottom of the opening. This etching is preferably performed in a manner to form a beveled surface 1402 at the bottom of the opening 1102 as shown in FIG. 14. This beveled surface has been found to provide an optimal surface for the epitaxial growth of semiconductor material.

Figure 15:
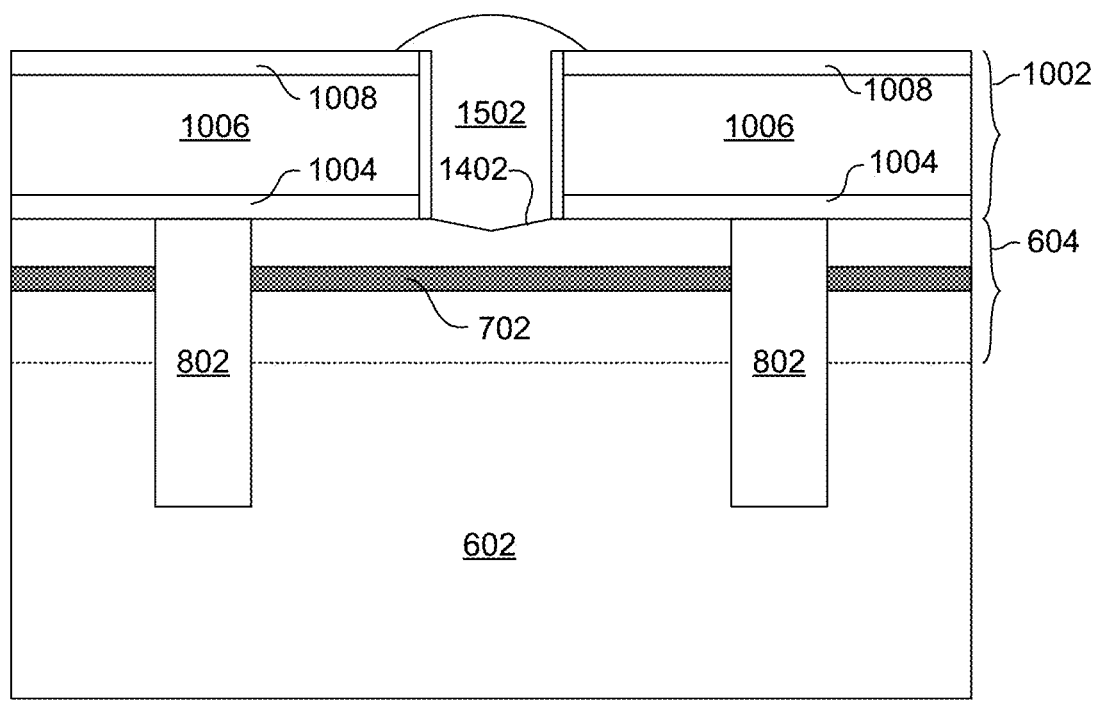
Figure 16:
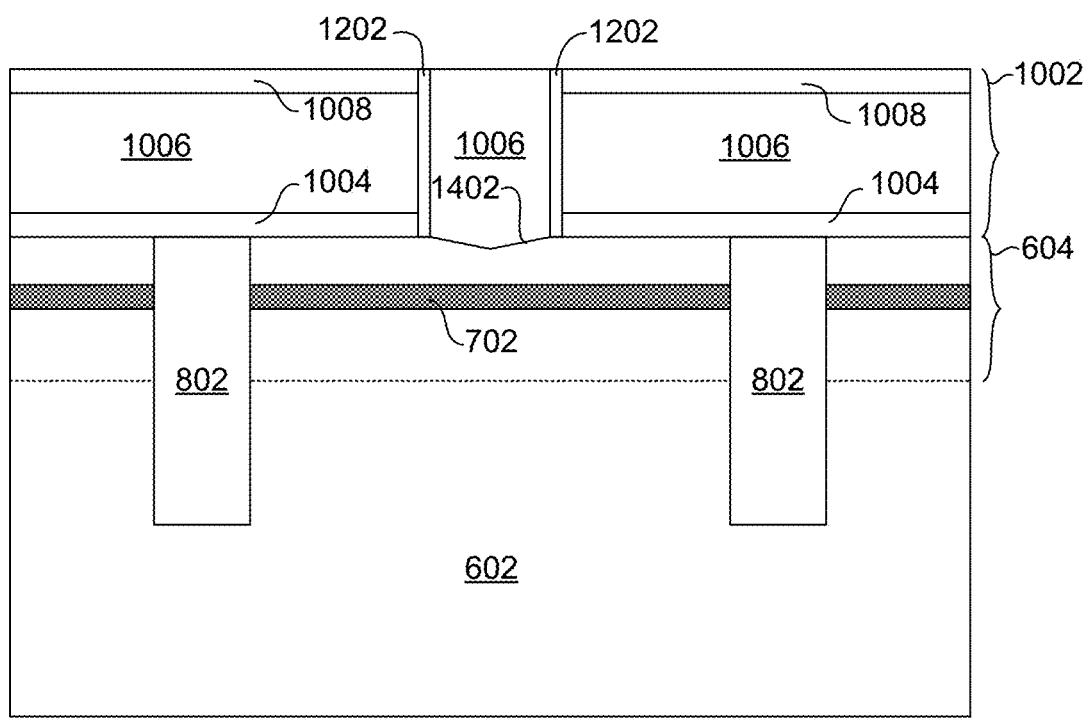

With reference to FIG. 15, a semiconductor material 1502 is grown epitaxially within the opening 1102 on the etched surface 1402. This epitaxial growth of semiconductor can be performed sufficiently that the semiconductor material 1502 extends out of the opening 1102 in the gate structure layers 1002. A chemical mechanical polishing process (CMP) can be performed to remove the portion of the semiconductor material 1502 extending out of the opening 1102. This leaves a semiconductor pillar structure 1502 surrounded at its sides by a thin gate dielectric layer 1202 as shown in FIG. 16. The semiconductor pillar structure 1502 can be doped during the epitaxial growth of the pillar or can be subsequently doped with implantation. The doping concentration of the channel 1502 can be chosen to be in the range of intrinsic silicon all the way to $10^{19}/cm^3$. The best option is to choose a channel doping level that allows electrical operation in the region of the channel being fully depleted. An upper portion of the semiconductor pillar 1502 can be doped either by ion bombardment with a doping material or through deposition of a semiconductor material along with a doping material and subsequent annealing at high temperature to diffuse and activate the dopant. Similar annealing allows the dopant from layer 604 to diffuse upwards to form the source of the transistor.

Figure 17:
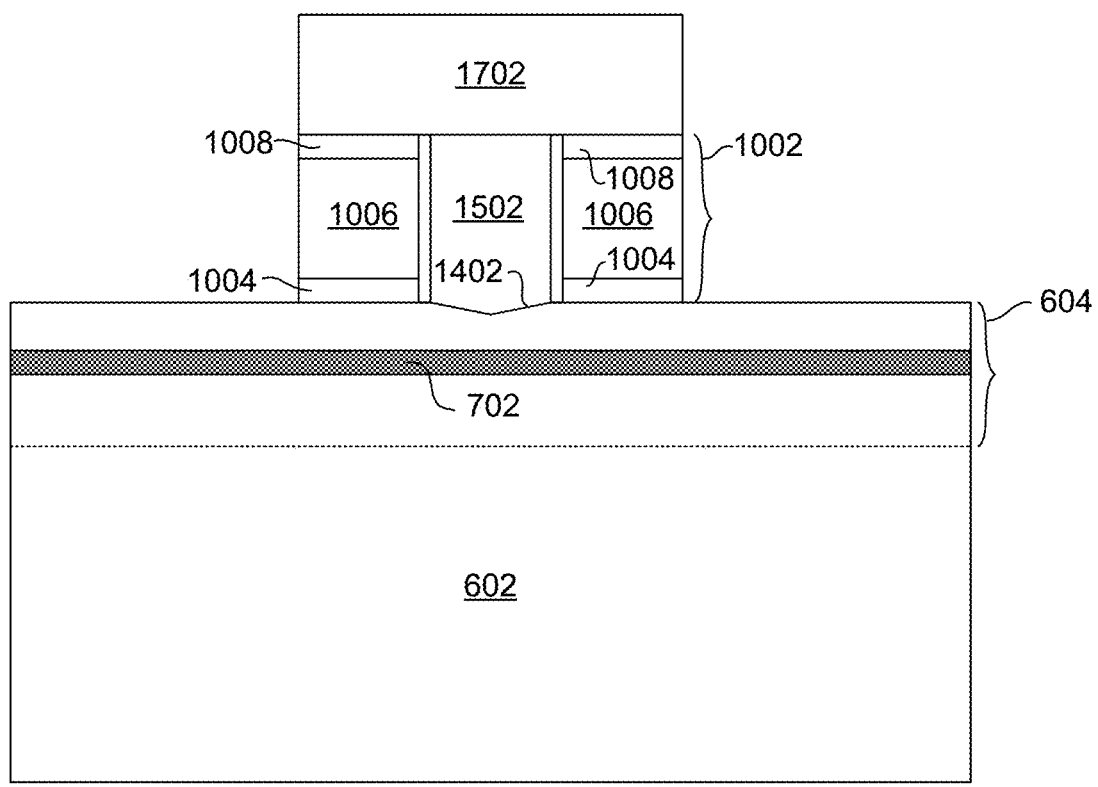
Figure 18:
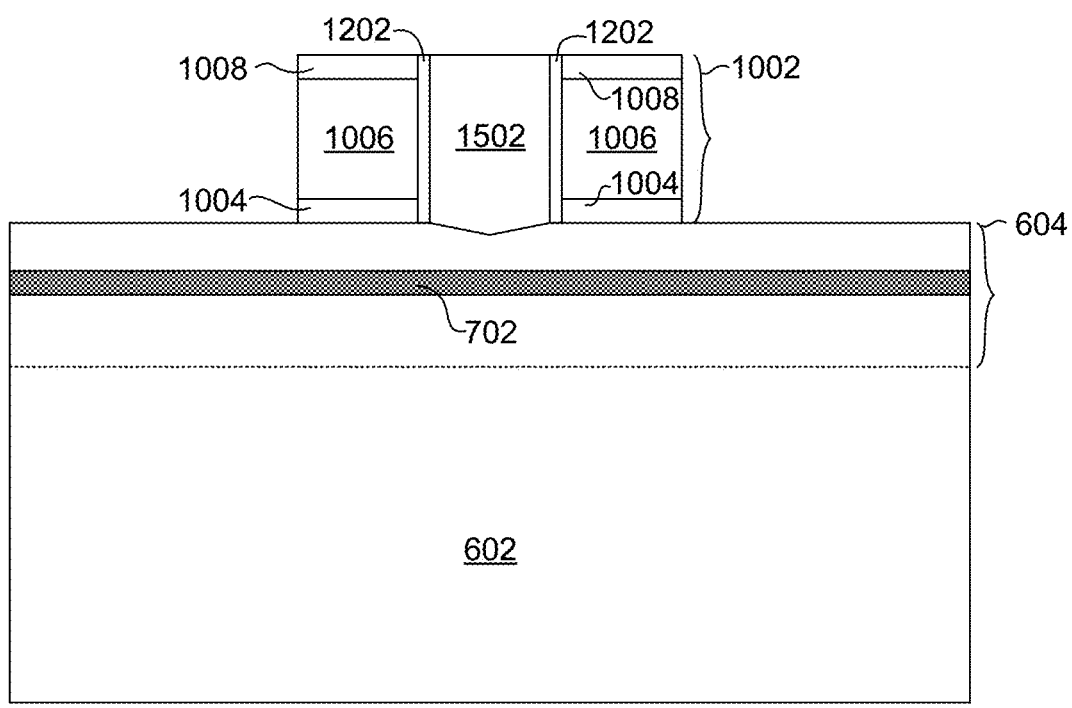
Figure 19:
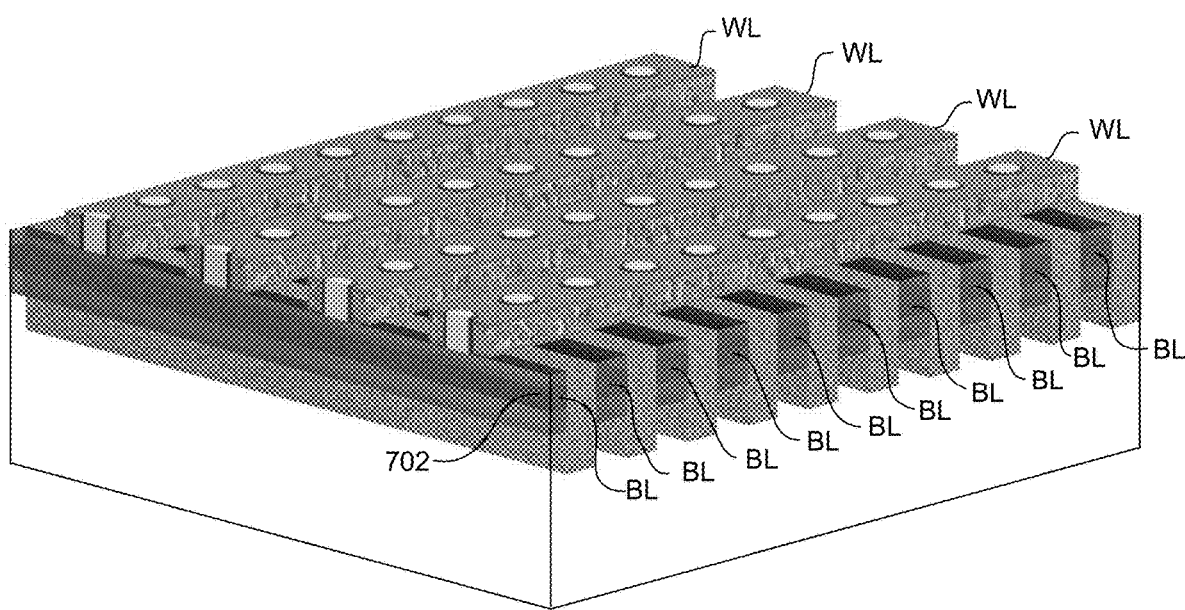

FIG. 17 shows a cross-sectional view as seen from line 17-17 of FIG. 16, which is along a plane that is perpendicular to that of FIG. 16. With reference now to FIG. 17, a mask 1702 is formed. The mask 1702 is configured to define a plurality of word-line structures, only one of which is shown in FIG. 17. An etching process such as reactive ion etching (RIE) or ion beam etching (IBE) to remove portions of the gate structure layers 1002 (FIG. 16) that are not protected by the mask 1702, leaving a gate structure 1704 as shown in FIG. 17, that is formed over and extending slightly past the semiconductor pillar structure 1502 and gate dielectric layer 1202. After etching, the mask 1702 can be removed, leaving a structure as shown in FIG. 18. It should be pointed out that the mask 1702 and resulting gate structure 1704 extend into and out of the plane of the page in FIG. 17 to surround multiple semiconductor pillar structures 1502 and gate dielectric layers 1202. This can be seen more clearly with reference to FIG. 19, which shows an enlarged perspective view of the resulting structure with a plurality of gate structures forming word lines WL that can be perpendicular to the previously formed plurality of bit lines 902 formed by the buried metal silicide layer 702.

Figure 20:
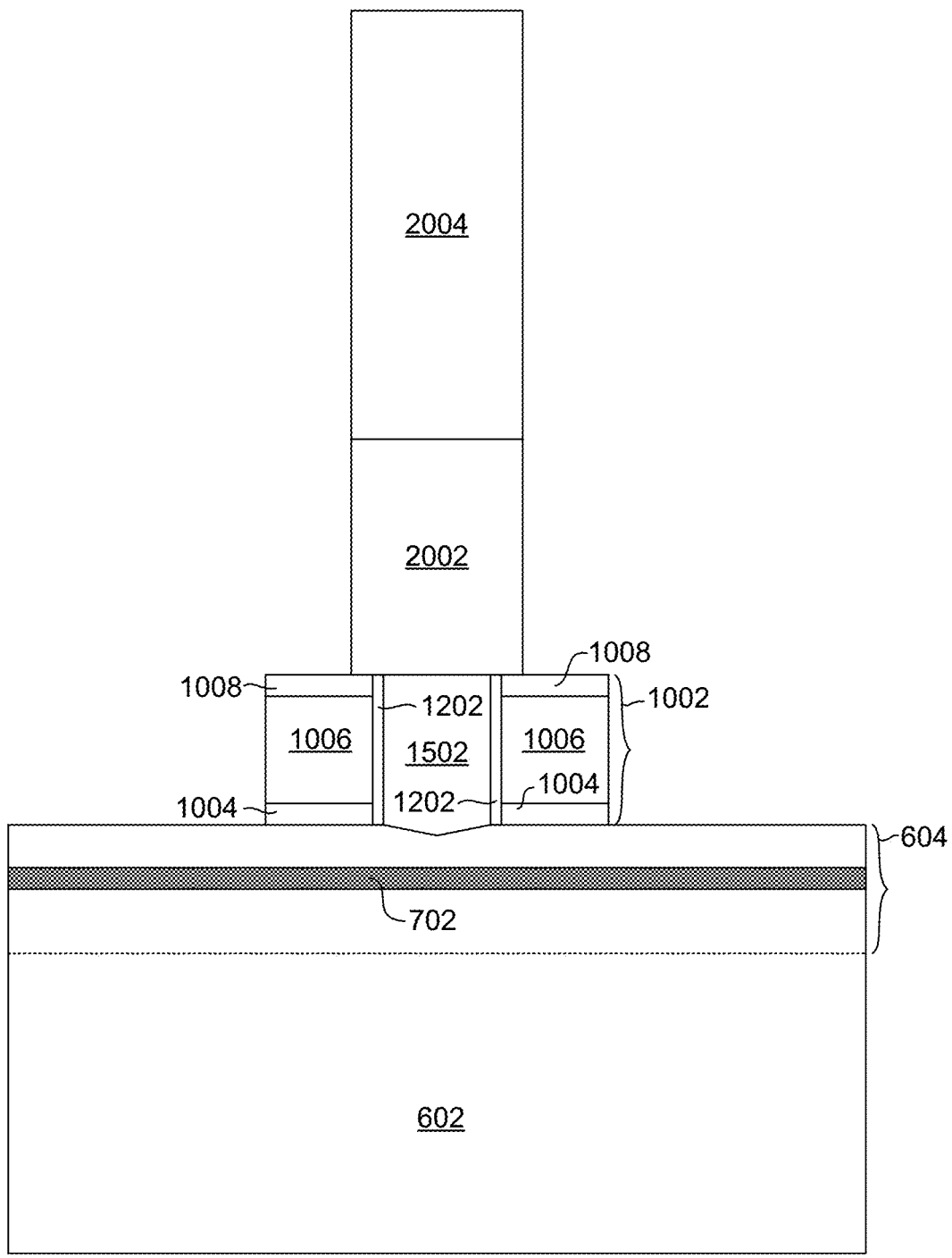

With reference now to FIG. 20, an electrically conductive contact 2002 can be formed over the semiconductor pillar structure 1502. A capacitor structure 2004 can then be formed over the electrically conductive contact 2002, such that the contact 2002 electrically connects the capacitor structure 2004 with the semiconductor pillar structure 1502.

Figure 21:
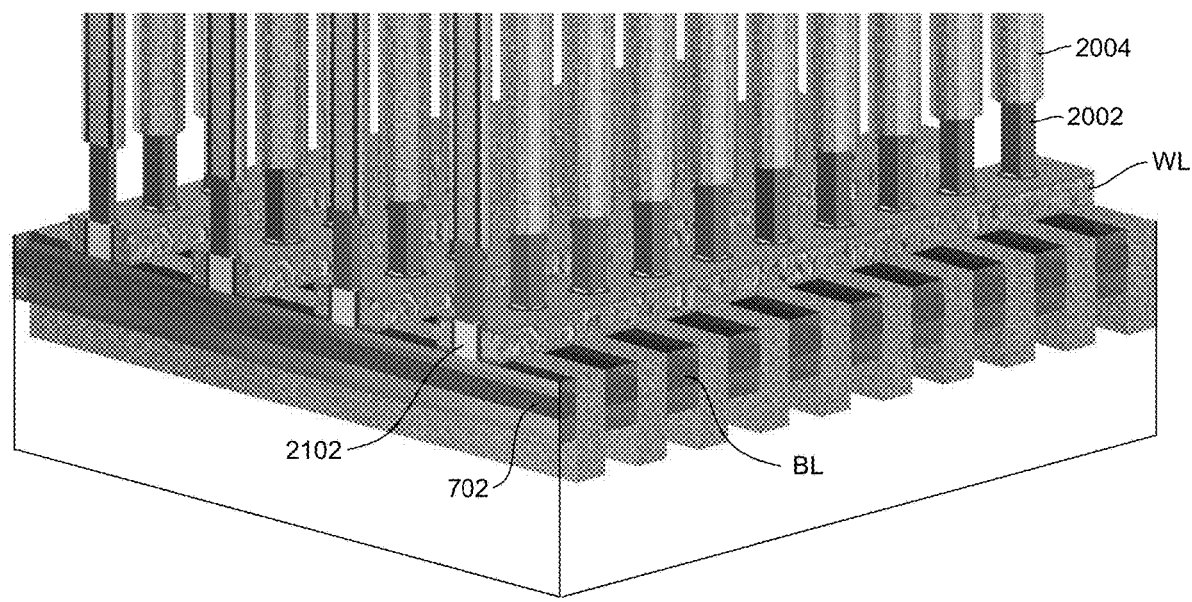

FIG. 21 shows a perspective view of a memory array 2200 formed by the above described process. The memory array 2200 includes a rows and columns of capacitive memory elements 2004 connected with each connected with a semiconductor pillar structure 1502 of a vertical transistor structure. The vertical transistor structures 2102 contacts 2002, and capacitive memory elements 2004 are arranged in rows that are connected with gate structures 1704 that form wordlines WL. In addition, the vertical transistor structures 2102, contacts 2002, and capacitive memory elements 2004 are arranged in columns that are electrically connected with buried metal silicide structures that form bitlines BL.

Figure 22:
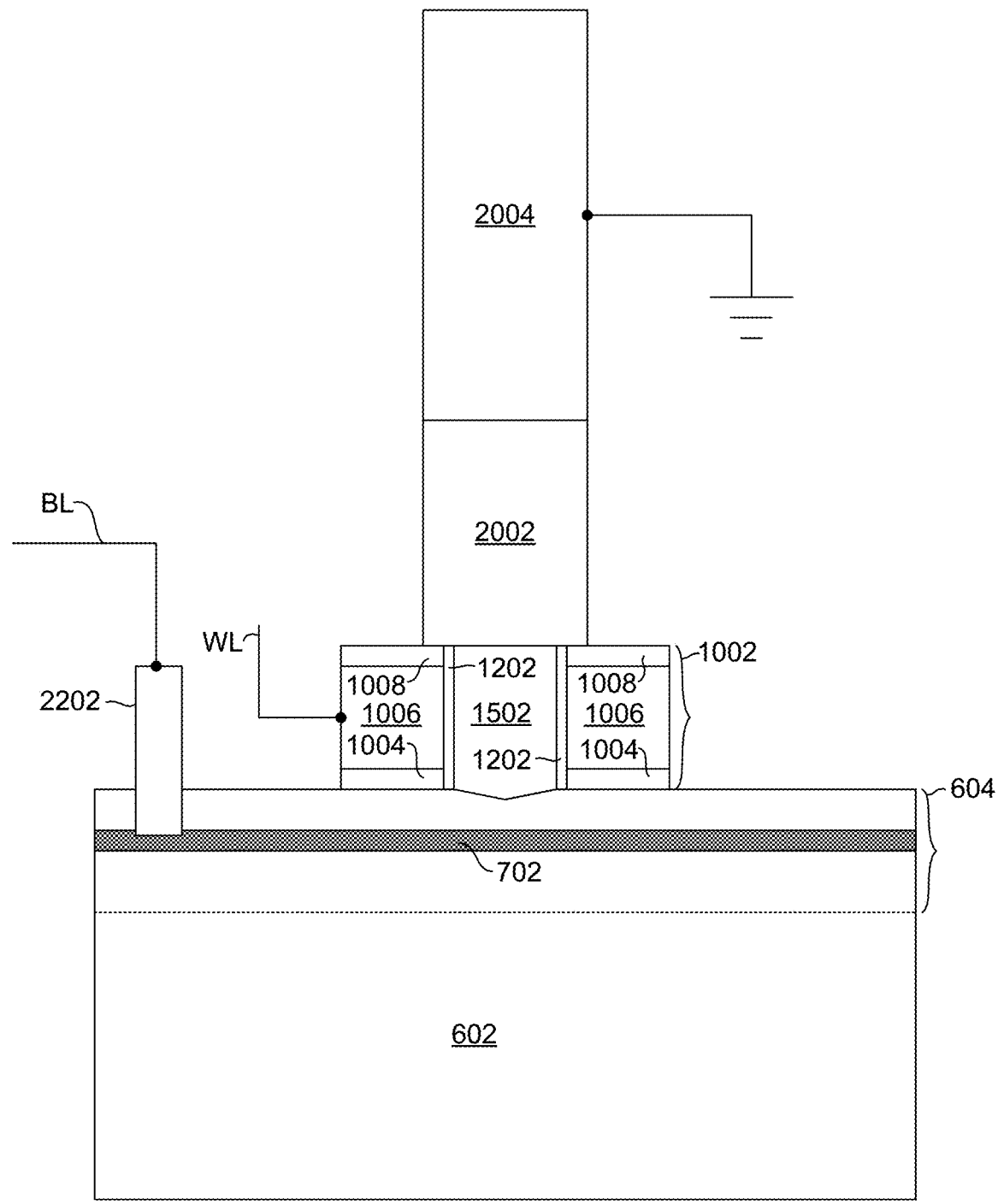

FIG. 22 shows a cross-sectional view of a memory cell of a memory array along a plane that is parallel with the direction of a bitline BL. A via contact structure 2202 can be formed in the substrate to make electrical contract with the metal silicide structure 702. The via contact 2202 is an electrically conductive material and can be electrically connected with bitline circuitry BL. The outer side of the capacitive memory element 2004, also called the plate, can be electrically connected with ground or can be connected with some other constant voltage. In addition, the electrically conductive gate material 1006 can be electrically connected with wordline circuitry WL.

The above described DRAM structure and method for manufacture thereof, provide significant advantages with regard to performance as well as density. The use of a vertical transistor structure employing an epitaxially grown vertical semiconductor pillar structure provides benefits with regard to cost, immunity from row hammer disturb, and improvements in radiation hardness and better, lower power refresh. In addition, the use of the buried bitline using mesotaxy or allotaxy allows for the conservation of all of these benefits in a much smaller cell footprint, thereby greatly increasing data density.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A memory structure, comprising:
    a semiconductor substrate having a doped region;
    a metal silicide layer buried within the doped region of the substrate;
    a vertical transistor structure formed on the doped region of the substrate;
    a capacitive memory element electrically connected with the vertical transistor structure; and
    an electrically conductive contact formed between the vertical transistor structure and the capacitive memory element;
    wherein the vertical transistor structure comprises an electrically conductive gate structure formed on the doped region of the substrate, the electrically conductive gate structure comprising a first dielectric layer above the doped region of the substrate, an electrically conductive gate layer over the first dielectric layer, and a second dielectric layer over the electrically conductive gate layer and under the electrically conductive contact.

2. The memory structure as in claim 1, wherein the vertical transistor structure further comprises:
    a semiconductor pillar structure formed on the doped portion of the substrate; and
    a gate dielectric layer formed at a side of the semiconductor pillar structure;
    wherein the electrically conductive gate structure at least partially surrounds the semiconductor pillar structure and the gate dielectric layer such that the gate dielectric layer separates the electrically conductive gate structure from the semiconductor pillar structure.

3. The memory structure as in claim 2, wherein the semiconductor pillar structure comprises an epitaxial semiconductor material.

4. The memory structure as in claim 2, wherein the semiconductor pillar structure comprises a substantially monocrystalline semiconductor material.

5. The memory structure as in claim 2, wherein the semiconductor pillar structure comprises a semiconductor material that is at least 80 percent monocrystalline by volume.

6. The memory structure as in claim 2, wherein the semiconductor pillar structure comprises a semiconductor material that is at least 90 percent monocrystalline by volume.

7. The memory structure as in claim 1, wherein the doped region of the semiconductor substrate and the buried silicide layer are divided into a line that defines a bitline structure.

8. The memory structure as in claim 7, wherein the buried silicide layer is electrically connected with bitline circuitry.

9. The memory structure as in claim 8, wherein the electrically conductive gate structure is electrically connected with wordline circuitry.

10. A data memory array comprising:
    a semiconductor substrate;
    a plurality of bitline structures formed on the semiconductor substrate, each of the bitline structures further comprising a doped semiconductor and a metal silicide layer buried in the doped semiconductor; and
    a plurality of memory cells each formed on the bitline structures, each of the memory cells further comprising:
    a vertical semiconductor structure, a capacitive memory element electrically connected with the vertical semiconductor structure, and an electrically conductive contact formed between the vertical semiconductor structure and the capacitive memory element;
    wherein the vertical semiconductor structure comprises an electrically conductive gate structure formed on the doped semiconductor, the electrically conductive gate structure comprising a first dielectric layer above the doped semiconductor, an electrically conductive gate layer over the first dielectric layer, and a second dielectric layer over the electrically conductive gate layer and under the electrically conductive contact.

11. The memory array as in claim 10, wherein each of the vertical semiconductor structures further comprises:
    a semiconductor pillar structure formed on the doped semiconductor; and
    a gate dielectric layer formed at a side of the semiconductor pillar structure,
    wherein the electrically conductive gate structure at least partially surrounds the semiconductor pillar structure and the gate dielectric layer such that the gate dielectric layer separates the electrically conductive gate structure from the semiconductor pillar structure.

12. The memory array as in claim 11, wherein the semiconductor pillar structure comprises epitaxial semiconductor material.

13. The memory array as in claim 11, wherein the semiconductor pillar structure comprises substantially monocrystalline semiconductor material.

14. A method for manufacturing a magnetic memory structure, comprising:
    providing a substrate;
    forming a doped region on the substrate;
    forming a metal silicide layer buried within the doped region;
    forming a vertical transistor structure on the doped region of the substrate;
    forming an electrically conductive contact over the vertical transistor structure; and
    forming a capacitive memory element over the electrically conductive contact, the capacitive memory element being electrically connected with the vertical transistor structure;
    wherein forming the vertical transistor structure comprises depositing gate structure layers, the gate structure layers comprising a first dielectric layer above the doped region of the substrate, an electrically conductive gate layer over the first dielectric layer, and a second dielectric layer over the electrically conductive gate layer and under the electrically conductive contact.

15. The method as in claim 14, wherein the silicide layer is formed by allotaxy.

16. The method as in claim 14, wherein the metal silicide layer is formed by mesotaxy.

17. The method as in claim 14, wherein forming the vertical transistor structure further comprises epitaxially growing a semiconductor pillar on the doped region.

18. The method as in claim 17, wherein forming the vertical transistor structure further comprises forming a gate dielectric layer at a side of the semiconductor pillar structure and forming an electrically conductive gate structure adjacent to the gate dielectric layer such that the gate dielectric layer is between the electrically conductive gate structure and the semiconductor pillar structure.

19. The method as in claim 17, wherein forming the vertical transistor structure further comprises:
    forming an opening in the gate structure layers, the opening extending to a doped portion of the substrate;

forming a gate dielectric layer on an inner side of the opening;

performing an etching to remove native oxide from the doped portion exposed through the opening; and epitaxially growing a semiconductor material on an etched surface of the doped portion of the substrate.

\* \* \* \* \*